US012757645B2

(12) United States Patent
Rodriguez Alvarez et al.

(10) Patent No.: US 12,757,645 B2
(45) Date of Patent: Oct. 6, 2026

(54) METHOD FOR MANUFACTURING A SILICON CARBIDE SEMICONDUCTOR COMPONENT INCLUDING A MONOCRYSTALLINE SILICON CARBIDE SUBSTRATE AND A POLYCRYSTALLINE SILICON CARBIDE SUBSTRATE

(71) Applicant: Robert Bosch GmbH, Stuttgart (DE)

(72) Inventors: Humberto Rodriguez Alvarez, Kornwestheim (DE); Jan-Hendrik Alsmeier, Pfullingen (DE)

(73) Assignee: Robert Bosch GmbH, Stuttgart (DE)

( * ) Notice: Subject to any disclaimer, the term of this patent is extended or adjusted under 35 U.S.C. 154(b) by 334 days.

(21) Appl. No.: 18/573,300

(22) PCT Filed: Jul. 1, 2022

(86) PCT No.: PCT/EP2022/068240
§ 371 (c)(1),
(2) Date: Dec. 21, 2023

(87) PCT Pub. No.: WO2023/275352
PCT Pub. Date: Jan. 5, 2023

(65) Prior Publication Data

US 2024/0371632 A1 Nov. 7, 2024

(30) Foreign Application Priority Data

Jul. 2, 2021 (DE) ..................... 10 2021 206 965.7

(51) Int. Cl.
*H01L 21/02* (2006.01)
*H10P 14/20* (2026.01)

(52) U.S. Cl.
CPC ...... *H10P 14/2904* (2026.01); *H10P 14/2922* (2026.01); *H10P 14/3411* (2026.01); *H10P 14/3808* (2026.01)

(58) Field of Classification Search
CPC ............. H10P 14/2904; H10P 14/3808; H10P 14/2922; H10P 14/3411
See application file for complete search history.

(56) References Cited

U.S. PATENT DOCUMENTS 3,728,165 A * 4/1973 Howlett ............. H10N 60/0184 428/668
5,349,207 A * 9/1994 Malhi ................ H10D 62/8325 438/455

(Continued)

FOREIGN PATENT DOCUMENTS

CN 1705078 A * 12/2005 ........... H10D 30/751
CN 117406337 A * 1/2024 ............... G02B 6/13

(Continued)

OTHER PUBLICATIONS

International Search Report for PCT/EP2022/068240, Issued Oct. 21, 2022.

(Continued)

*Primary Examiner* — Peter Bradford
(74) *Attorney, Agent, or Firm* — Norton Rose Fulbright US LLP

(57) ABSTRACT

A method for manufacturing a silicon carbide semiconductor component including a monocrystalline silicon carbide substrate and a polycrystalline silicon carbide substrate. The method includes: depositing a silicon layer onto the polycrystalline silicon carbide substrate; depositing a germanium layer onto the monocrystalline silicon carbide substrate; connecting the silicon layer and the germanium layer by a first laser, laser beams being coupled in through the polycrystalline silicon carbide substrate, and a connection layer consisting of silicon and germanium being produced; creating active regions on or within the monocrystalline silicon carbide substrate; depositing a glass substrate onto the active regions, the glass substrate being connected to the (Continued)

active regions by means of an adhesion layer; and removing the connection layer using a third laser, laser beams being coupled in through the polycrystalline silicon carbide substrate.

7 Claims, 2 Drawing Sheets

(56) References Cited

U.S. PATENT DOCUMENTS

| | | | | |
|---|---|---|---|---|
| 8,080,826 | B1 * | 12/2011 | Johnson | H10P 90/1914 257/77 |
| 8,216,929 | B2 | 7/2012 | Kawai et al. | |
| 2018/0251911 | A1 * | 9/2018 | Kubota | H01L 21/02447 |
| 2019/0244853 | A1 | 8/2019 | Berger et al. | |
| 2024/0258105 | A1 * | 8/2024 | Leitgeb | H01L 21/02378 |

FOREIGN PATENT DOCUMENTS

| | | | | |
|---|---|---|---|---|
| DE | 102009054659 | A1 | 6/2011 | |
| DE | 102017127169 | A1 | 5/2019 | |
| DE | 102019116228 | A1 | 12/2020 | |
| WO | WO-2022184630 | A1 * | 9/2022 | H01L 21/02664 |
| WO | WO-2024240961 | A1 * | 11/2024 | H01L 21/02002 |

OTHER PUBLICATIONS

Ke et al., "A Review: Wafer Bonding of Si-Based Semiconductors," Journal of Physics D: Applied Physics, Institute of Physics Publishing, vol. 53, No. 32, 2020, pp. 1-70. <https://sci-hub.ru/10.1088/1361-6463/ab8769> Downloaded Dec. 20, 2023.

* cited by examiner

METHOD FOR MANUFACTURING A SILICON CARBIDE SEMICONDUCTOR COMPONENT INCLUDING A MONOCRYSTALLINE SILICON CARBIDE SUBSTRATE AND A POLYCRYSTALLINE SILICON CARBIDE SUBSTRATE

FIELD

The present invention relates to a method for manufacturing a silicon carbide semiconductor component.

BACKGROUND INFORMATION

Silicon carbide semiconductor components are usually produced on monocrystalline silicon carbide substrates having a substrate thickness of more than 300 μm. After completion of the front side of the silicon carbide semiconductor components, the substrate thickness is reduced to a specific target thickness below 200 μm by means of grinding processes.

A disadvantage here is that the manufacturing process is expensive since a large portion of the monocrystalline silicon carbide substrate is removed.

An object of the present invention is to overcome this disadvantage.

SUMMARY

A method according to an example embodiment of the present invention for manufacturing a silicon carbide semiconductor component comprising a monocrystalline silicon carbide substrate and a polycrystalline silicon carbide substrate, wherein the monocrystalline silicon carbide substrate has a substrate thickness in the range between 50 μm and 100 μm, comprises depositing a silicon layer onto the polycrystalline silicon carbide substrate by means of physical vapor deposition and depositing a germanium layer onto the monocrystalline silicon carbide substrate by means of physical vapor deposition. The method comprises connecting the silicon layer and the germanium layer by means of a first laser, wherein laser beams are coupled in through the polycrystalline silicon carbide substrate and a connection layer consisting of silicon and germanium is produced, and creating active regions of the silicon carbide semiconductor component on or within the monocrystalline silicon carbide substrate, wherein high temperature processes are performed by means of a second laser having a wavelength of approximately 350 nm and an energy density of 0.5 $J/cm^2$ to 5 $J/cm^2$. The method comprises depositing a glass substrate onto the active regions of the silicon carbide semiconductor component, wherein the glass substrate is connected to the active regions by means of an adhesion layer, and removing the connection layer by means of a third laser, wherein the laser beams are coupled in through the polycrystalline silicon carbide substrate. The term "active regions" of the silicon carbide semiconductor component is understood to mean n- or p-doped zones which, for example, form channel zones or diode zones which are located within the monocrystalline silicon carbide substrate, or contact regions which are located on the monocrystalline silicon carbide substrate.

An advantage here is that the manufacturing process is cost-effective and the polycrystalline silicon carbide substrate can be reused for the manufacture of further silicon carbide semiconductor components.

In a development of the present invention, the connecting of the silicon layer and the germanium layer is performed under vacuum conditions, wherein the vacuum conditions include pressures between 1 mbar and 3 mbar.

It is advantageous here that the required laser energy and temperature are moderate.

In a further embodiment of the present invention, the connecting of the silicon layer and the germanium layer is performed in a protective gas atmosphere with nitrogen or argon.

An advantage here is that no impurities can penetrate and that the resulting connection layer has good quality.

In a development of the present invention, the first laser and the third laser each generate or use a wavelength that is transmitted through the polycrystalline silicon carbide substrate and the silicon layer.

It is advantageous here that the laser energy is coupled in, or can be coupled in, precisely or with targeted precision in the region of the deposited layers of germanium and silicon.

In a further embodiment of the present invention, the first laser and the third laser each have an energy density between 1 $J/cm^2$ and 5 $J/cm^2$.

An advantage here is that the properties of the connection layer consisting of silicon and germanium can be adjusted precisely or with targeted precision.

In a development of the present invention, the silicon layer and/or the germanium layer have a layer thickness between 50 nm and 1000 nm.

It is advantageous here that the connection layer has good adhesive properties.

Further advantages can be found in the following description of exemplary embodiments of the present invention and in the rest of the disclosure herein.

BRIEF DESCRIPTION OF THE DRAWINGS

The present invention is explained below with reference to preferred embodiments and the figures.

DETAILED DESCRIPTION OF EXAMPLE EMBODIMENTS

Figure 1:
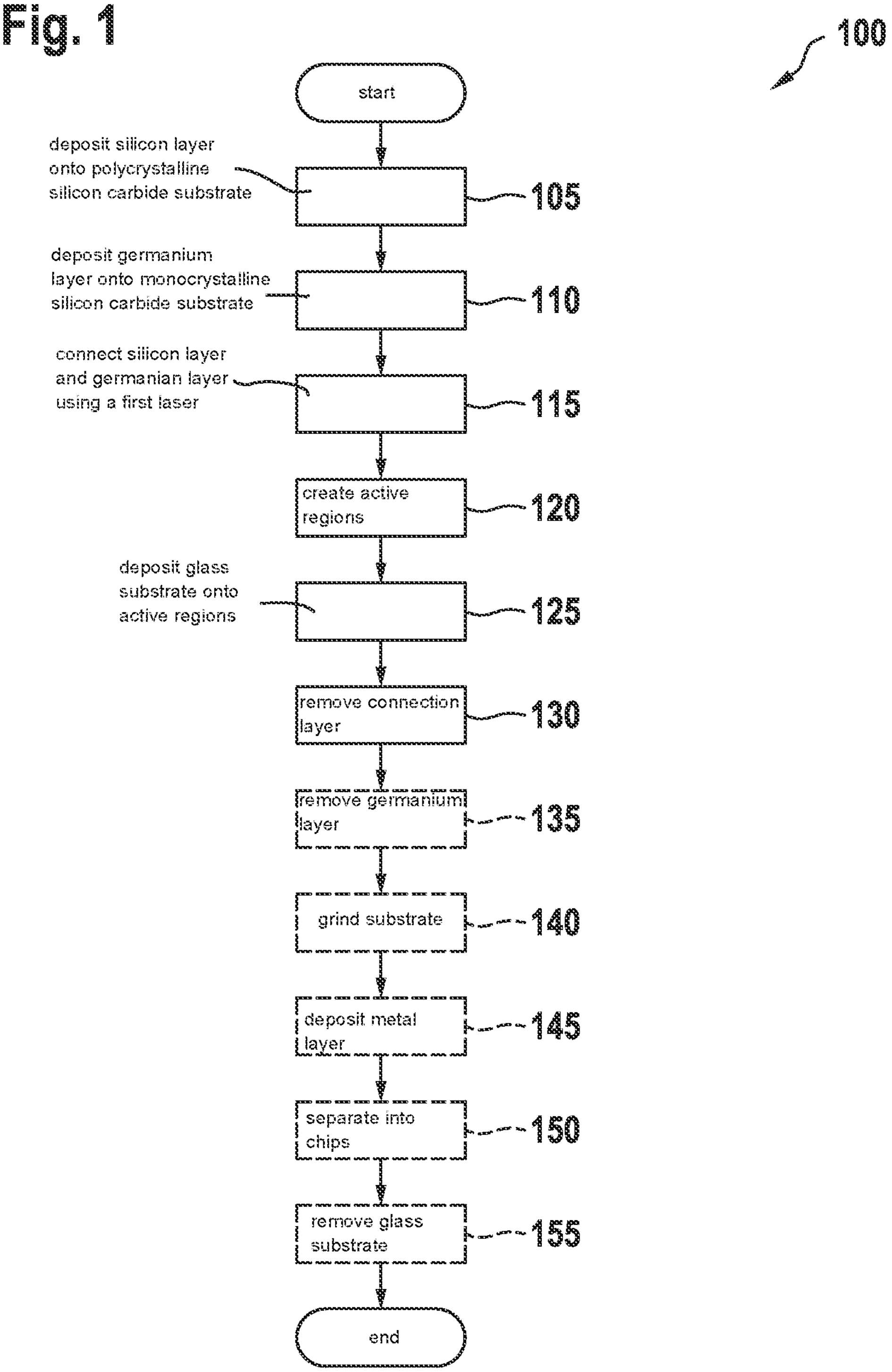
FIG. 1 shows a method according to an example embodiment of the present invention for manufacturing a silicon carbide semiconductor component, in particular a MOSFET.

FIG. 1 shows a method 100 according to the present invention for manufacturing a silicon carbide semiconductor component with a monocrystalline silicon carbide substrate and a polycrystalline silicon carbide substrate. The monocrystalline silicon carbide substrate has a substrate thickness in the range between 50 μm and 100 μm. This corresponds to the target thickness or approximately the target thickness of the silicon carbide semiconductor component. The method 100 starts with a step 105 in which a silicon layer is deposited onto the polycrystalline silicon carbide substrate by means of physical vapor deposition. In a subsequent step 110, a germanium layer is deposited onto the monocrystalline silicon carbide substrate by means of additional physical vapor deposition. In a subsequent step 115, the silicon layer and the germanium layer are connected by means of a first laser, wherein the laser beams are coupled in through the polycrystalline silicon carbide substrate. This leads to a solid-state reaction, wherein a connection layer consisting of silicon and germanium is produced. Connecting takes place, for example, under vacuum with pressures between 1 mbar and 3 mbar. Alternatively, the connecting of the silicon layer and the germanium layer is performed in a protective gas atmosphere with nitrogen or argon, for example at normal pressure or 1 bar. In a subsequent step 120, active regions of the silicon carbide semiconductor component are created on or within the monocrystalline silicon carbide semiconductor component, wherein high-temperature processes such as implantations are performed by means of a second laser having a wavelength of approximately 350 nm and an energy density of 0.5 $J/cm^2$ to 5 $J/cm^2$. As a result, the process temperature remains below a maximum permissible temperature of 1095° C. so that the connection layer consisting of silicon and germanium is not affected. In a subsequent step 125, a glass substrate is deposited onto the active regions of the silicon carbide semiconductor component, wherein the glass substrate is connected to the active regions by means of an adhesion layer. A thickness of the adhesion layer varies between 5 μm and 100 μm. The adhesion layer is locally electrically conductive and has a resistance value between 0.01 and 1e−5 $\Omega/cm^2$. As a result, undesired charges in the semiconductor component, which cannot discharge, are prevented, for example. In a subsequent step 130, the connection layer is removed by means of a third laser, wherein the laser beams are coupled in through the polycrystalline silicon carbide substrate. The first laser, the second laser, and the third laser are solid-state lasers, for example. The first laser and the third laser generate wavelengths that are transmitted through the polycrystalline silicon carbide substrate and the silicon layer. In other words, the laser beams are not absorbed by the polycrystalline silicon carbide substrate and the silicon layer. For example, a wavelength of 1440 nm is used. In addition, the first laser and the third laser have an energy density in the range between 1 $J/cm^2$ and 5 $J/cm^2$. The silicon layer and the germanium layer have a layer thickness between 50 nm and 1000 nm.

The silicon carbide semiconductor component is, for example, a MOSFET or a diode. For the manufacture of a MOSFET or a diode, after the removal 130 of the connection layer, the germanium layer on the monocrystalline silicon carbide substrate is first removed in a subsequent step 135 by means of a wet chemical etching process comprising, for example, hydrofluoric acid. In a subsequent step 145, a metal layer is deposited onto the side of the monocrystalline silicon carbide substrate on which the germanium layer was located. This metal layer acts as a drain electrode or as a contact electrode in the case of a diode. If a target thickness of less than 50 μm is required for the silicon carbide semiconductor component, the substrate can be ground to the corresponding target thickness in an optional step 140 between steps 135 and 145. In a step 155 following step 145, the glass substrate is removed by means of thermal treatment or UV light of the adhesion layer. Optionally, the monocrystalline silicon carbide semiconductor substrate can be separated into individual chips in a step 150 before the glass substrate is removed. Alternatively, an electrical current can be impressed into the adhesion layer, which current flows to the drain electrode or contact electrode, so that a defined amount of charge is present in the silicon carbide semiconductor component. The current density is applied for a duration of between 1 s and 1000 s and in this time varies between 0.1 $A/mm^2$ and 7 $A/mm^2$.

Figure 2:
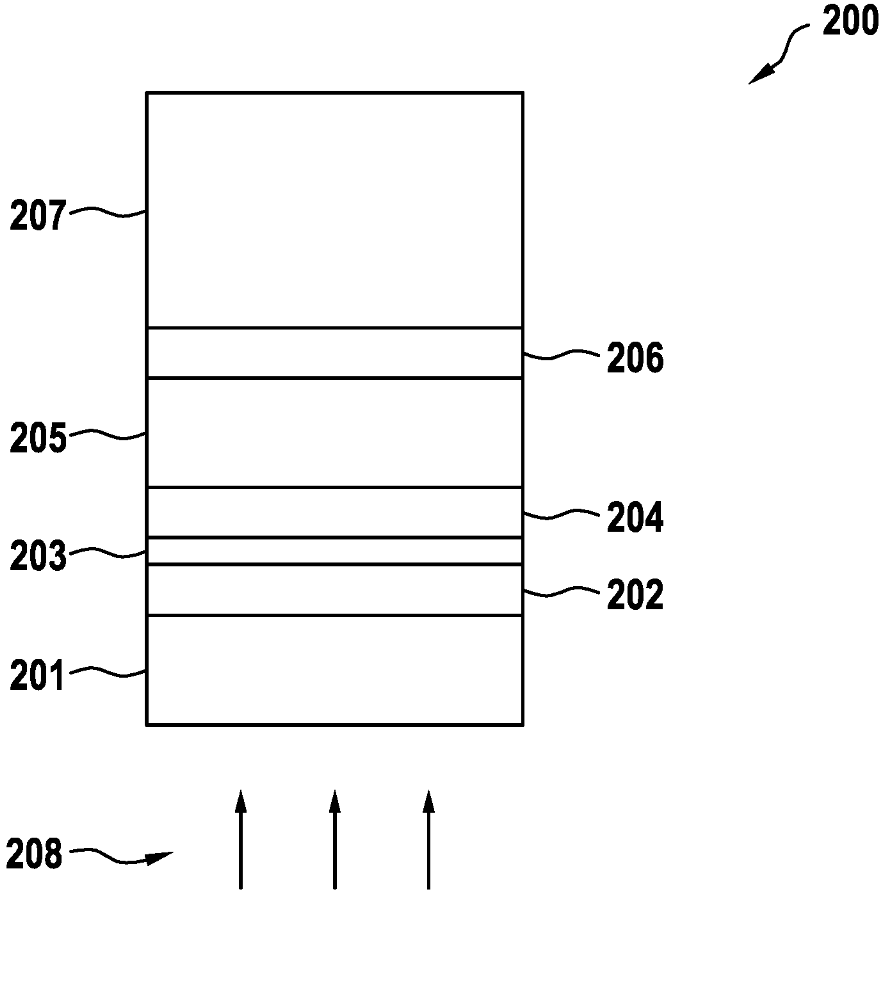
FIG. 2 shows an intermediate product of the silicon carbide semiconductor component to be manufactured, during the performance of method step 130.

FIG. 2 shows an intermediate product 200 of the silicon carbide semiconductor component to be manufactured, during the performance of method step 130. The intermediate product 200 comprises a polycrystalline silicon carbide substrate 201. A silicon layer 202 is arranged on the polycrystalline silicon carbide substrate 201. A connection layer 203 which comprises silicon and germanium is arranged on the silicon layer 202. A germanium layer 204 is arranged on the connection layer 203. A monocrystalline silicon carbide substrate 205 is arranged on the germanium layer 204. An adhesion layer 206 which connects the monocrystalline silicon carbide substrate 205 and a glass substrate 207 is arranged on the monocrystalline silicon carbide substrate 205. FIG. 2 shows laser beams 208 which break up or remove the connection layer 203. Silicon layer 202 and germanium layer 204 have a layer thickness between 50 nm and 1000 nm. The layer thickness of the silicon layer 202 can differ from the layer thickness of the germanium layer 204.

The monocrystalline silicon carbide substrate is, for example, a 4H, 6H, or 3C silicon carbide substrate.

The silicon carbide semiconductor component is used in the electric drive train of electric or hybrid vehicles, for example in the DC/DC converter or inverter, and in vehicle charging devices or inverters for domestic appliances.

The invention claimed is:

1. A method for manufacturing a silicon carbide semiconductor component including a monocrystalline silicon carbide substrate and a polycrystalline silicon carbide substrate, wherein the monocrystalline silicon carbide substrate has a substrate thickness in a range between 50 μm and 100 μm, comprising the following steps:

depositing a silicon layer onto the polycrystalline silicon carbide substrate using physical vapor deposition;

depositing a germanium layer onto the monocrystalline silicon carbide substrate using additional physical vapor deposition;

connecting the silicon layer and the germanium layer using a first laser, wherein for the connecting, laser beams are coupled in through the polycrystalline silicon carbide substrate, wherein a connection layer is formed by a laser-induced solid-state reaction between the silicon layer and the germanium layer, wherein the connection layer is located between the silicon layer and the germanium layer;

creating active regions of the silicon carbide semiconductor component on or within the monocrystalline silicon carbide substrate, wherein for the creating, high temperature processes are performed using a second laser having a wavelength of approximately 350 nm and an energy density of 0.5 $J/cm^2$ to 5 $J/cm^2$;

depositing a glass substrate onto the active regions of the silicon carbide semiconductor component, wherein the glass substrate is connected to the active regions using an adhesion layer; and removing the connection layer using a third laser, wherein for the removing, laser beams are coupled in through the polycrystalline silicon carbide substrate.

2. The method according to claim 1, wherein the connecting of the silicon layer and the germanium layer is performed under vacuum conditions, wherein the vacuum conditions include pressures between 1 mbar and 3 mbar.

3. The method according to claim 1, wherein the connecting of the silicon layer and the germanium layer is performed in a protective gas atmosphere with nitrogen or argon.

4. The method according to claim 1, wherein the first laser and the third laser each use a wavelength which is transmitted through the polycrystalline silicon carbide substrate and the silicon layer.

5. The method according to claim 1, wherein the first laser and the third laser each have an energy density between 1 $J/cm^2$ and 5 $J/cm^2$.

6. The method according to claim 1, wherein the silicon layer and/or the germanium layer has a layer thickness between 50 nm and 1000 nm.

7. The method according to claim 1, wherein the connection layer includes silicon and germanium.

* * * * *